(12) United States Patent
Campbell et al.

(10) Patent No.: US 12,132,273 B2
(45) Date of Patent: Oct. 29, 2024

(54) FLEXIBLE CIRCUIT TO TERMINAL CONNECTOR WITH WIPING ELECTRICAL CONTACTS

(71) Applicant: APTIV TECHNOLOGIES LIMITED, St. Michael (BB)

(72) Inventors: Jeffrey S. Campbell, West Bloomfield, MI (US); Wesley W. Weber, Lapeer, MI (US); Duane L. Brantingham, Cortland, OH (US); Kurt P. Seifert, Cortland, OH (US); David R. Peterson, Aurora, OH (US); Joon Lee, Carmel, IN (US)

(73) Assignee: APTIV TECHNOLOGIES AG, Schaffhausen (CH)

( * ) Notice: Subject to any disclaimer, the term of this patent is extended or adjusted under 35 U.S.C. 154(b) by 413 days.

(21) Appl. No.: 17/695,812

(22) Filed: Mar. 15, 2022

(65) Prior Publication Data

US 2022/0302619 A1    Sep. 22, 2022

Related U.S. Application Data

(60) Provisional application No. 63/161,755, filed on Mar. 16, 2021.

(51) Int. Cl.
*H01R 12/77* (2011.01)
*H01R 13/52* (2006.01)
*H01R 43/26* (2006.01)

(52) U.S. Cl.
CPC ....... *H01R 12/771* (2013.01); *H01R 13/5219* (2013.01); *H01R 43/26* (2013.01); *H01R 2201/26* (2013.01)

(58) Field of Classification Search
CPC ...... H01R 12/771; H01R 12/62; H01R 12/79; H01R 12/592; H01R 13/5219; H01R 43/26; H01R 2201/26; H01R 23/6826; H01R 23/684
USPC ............................ 439/67, 77, 492, 499, 260
See application file for complete search history.

(56) References Cited

U.S. PATENT DOCUMENTS

| | | | |
|---|---|---|---|
| 5,171,154 A * | 12/1992 | Casciotti | H01R 12/7082 439/465 |
| 5,741,148 A | 4/1998 | Biernath | |
| 6,053,746 A | 4/2000 | Yoshizawa | |
| 7,789,668 B1 * | 9/2010 | Hamner | H01R 12/89 439/260 |
| 2006/0228952 A1 * | 10/2006 | Feldman | H01R 4/024 439/835 |

(Continued)

FOREIGN PATENT DOCUMENTS

JP    2003208932 A    7/2003

OTHER PUBLICATIONS

European Search Report dated Nov. 28, 2022. 13 pages.

*Primary Examiner* — Gary F Paumen
(74) *Attorney, Agent, or Firm* — Miller Johnson

(57) ABSTRACT

Electrical connector systems and methods create an electrical connection between a flexible circuit (FC) and a metal terminal of another connector. A reliable electrical connection is achieved with a low-cost tin contact plating, by an automatic FC to metal terminal wiping action with contact force, during the connector to FC assembly process. The connector to FC assembly process is also well suited for automated robotic assembly, which can save costs compared to manual assembly/installation.

20 Claims, 9 Drawing Sheets

(56) References Cited

U.S. PATENT DOCUMENTS

| | | | |
|---|---|---|---|
| 2011/0159711 A1* | 6/2011 | Niitsu | H05K 3/365 439/67 |
| 2012/0045912 A1* | 2/2012 | Dai | H04R 25/556 29/874 |
| 2014/0106578 A1* | 4/2014 | Clayton | H01R 12/77 29/842 |

* cited by examiner

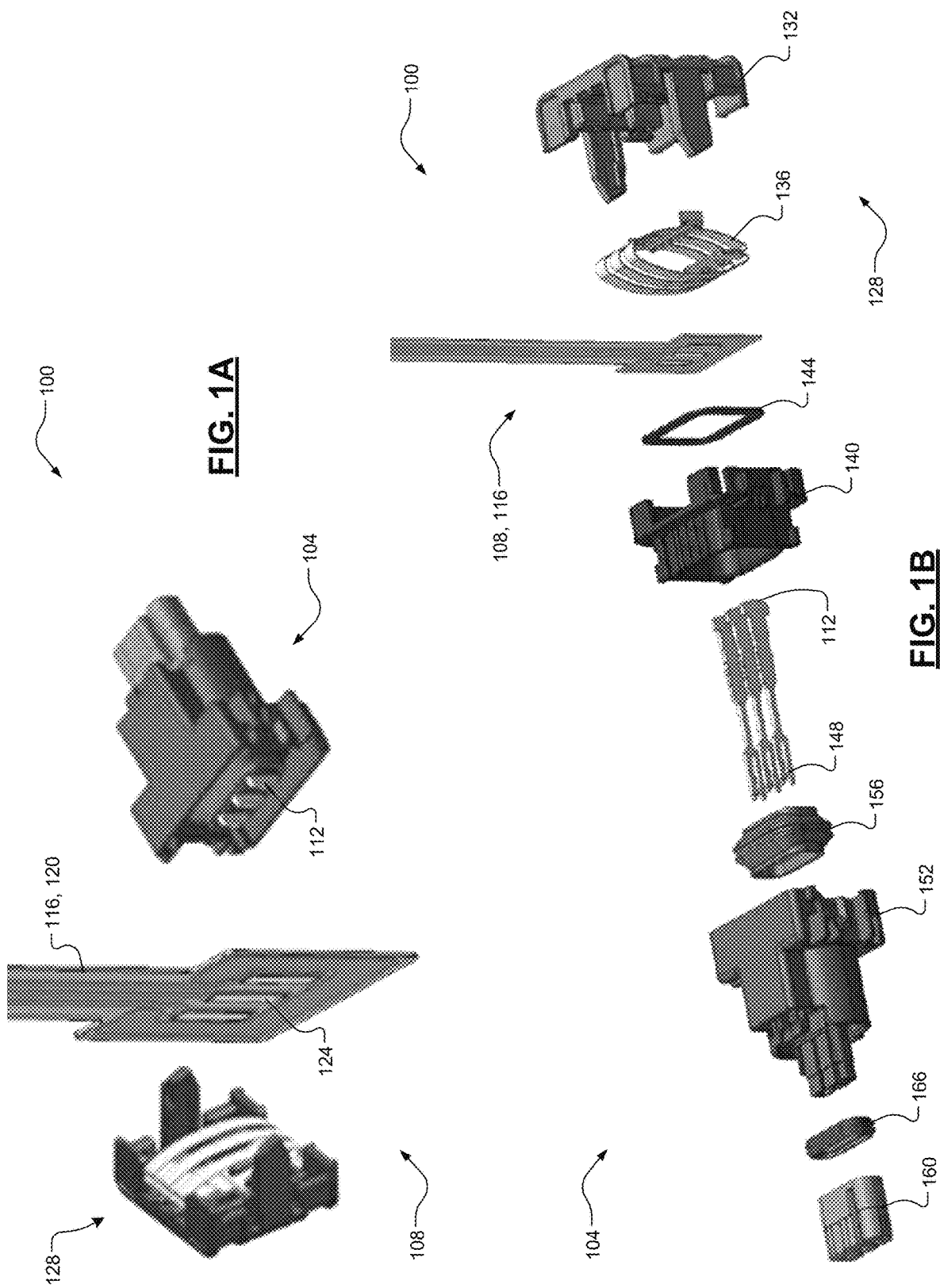

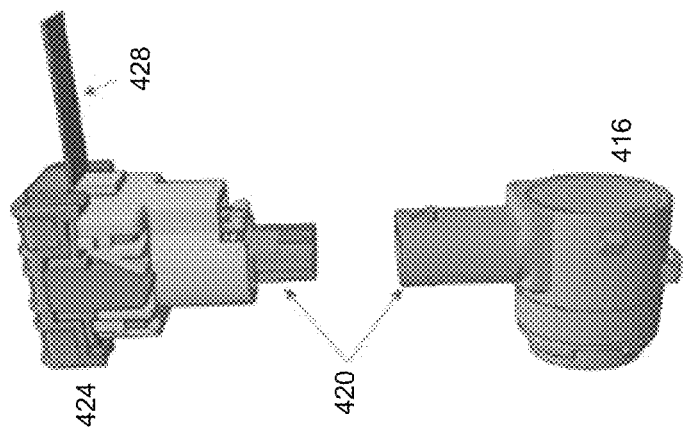
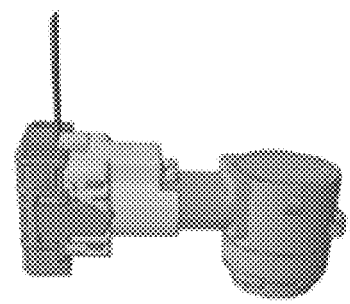
FIG. 4B
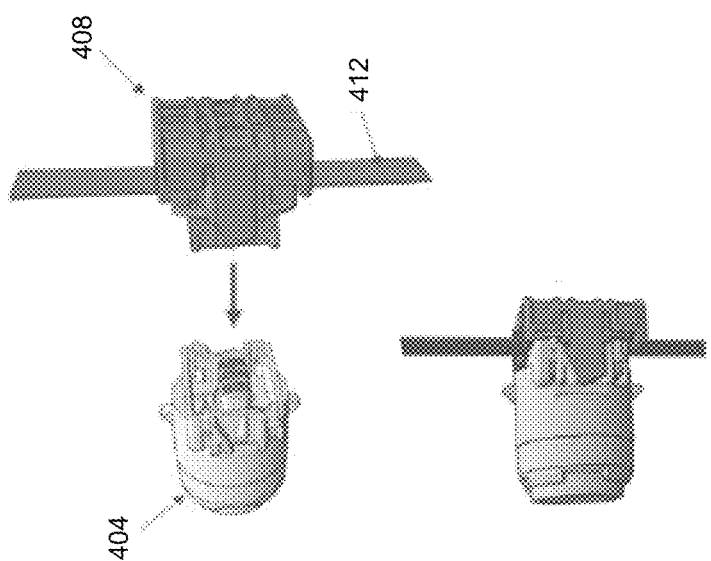
FIG. 4A

FIG. 6A
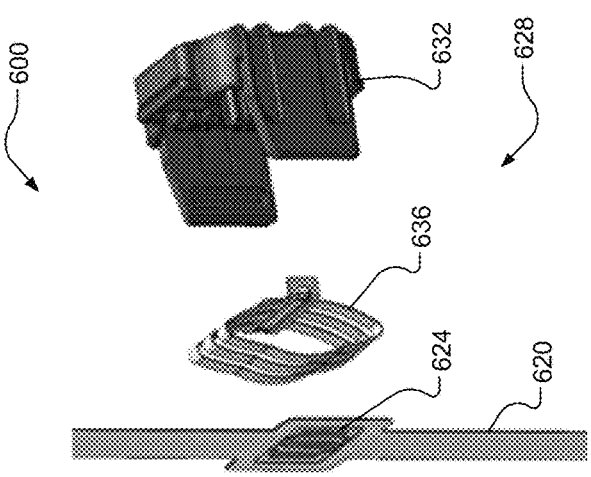
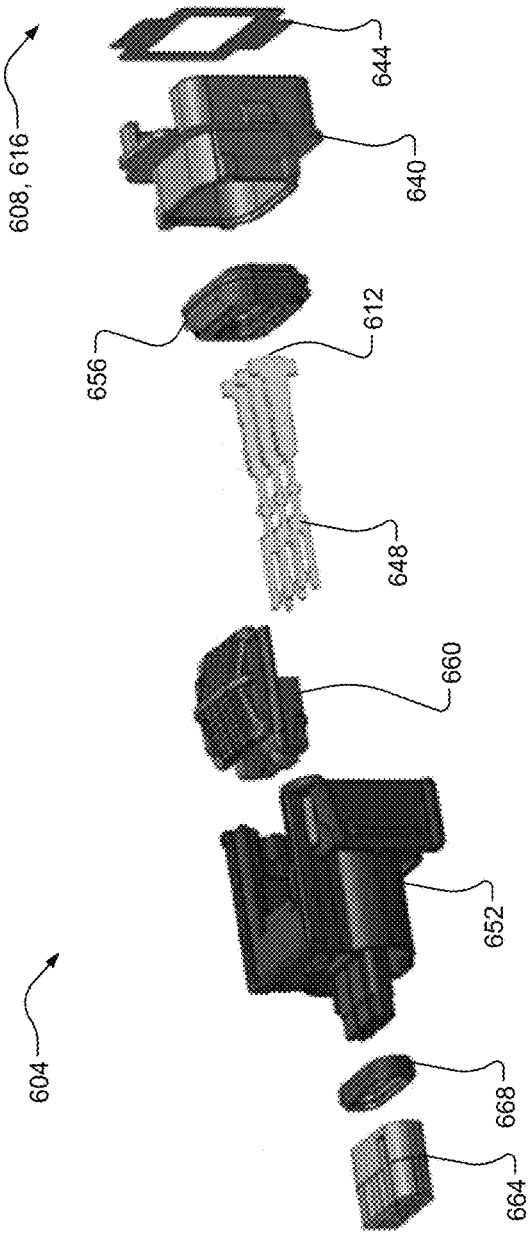
FIG. 6B

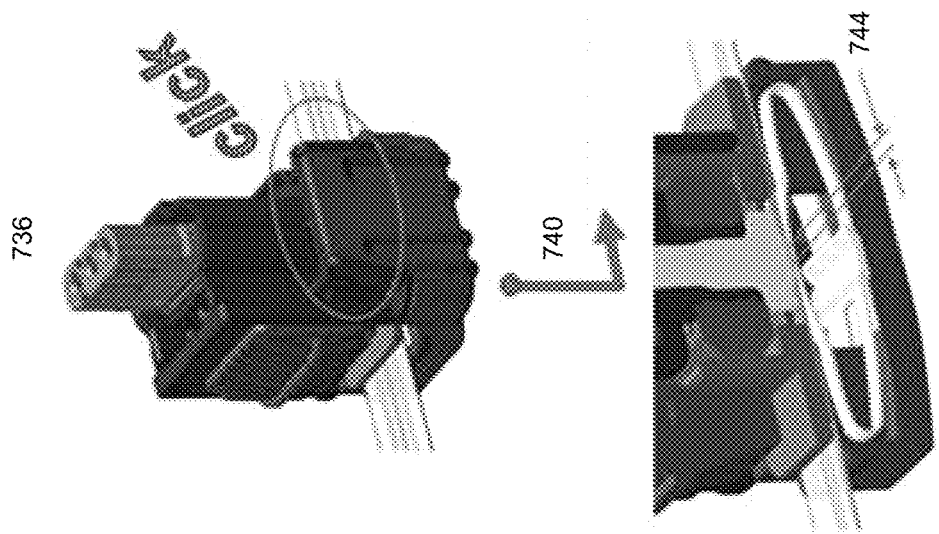
FIG. 7E
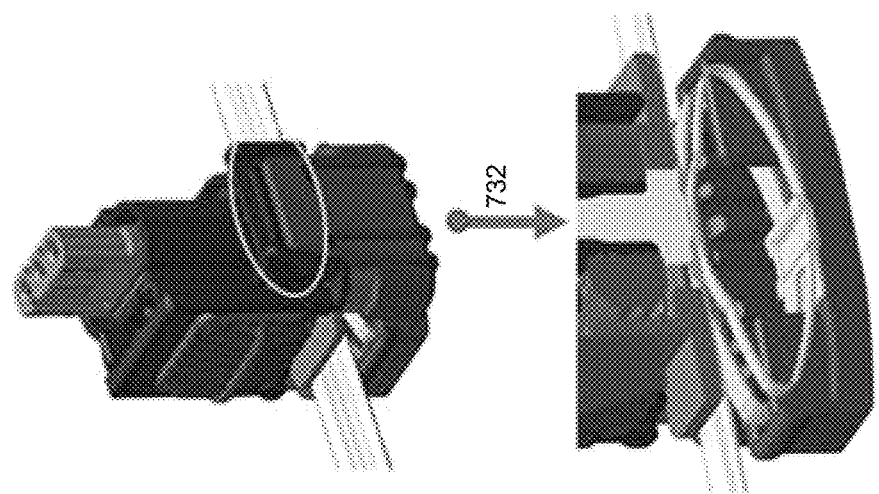
FIG. 7D
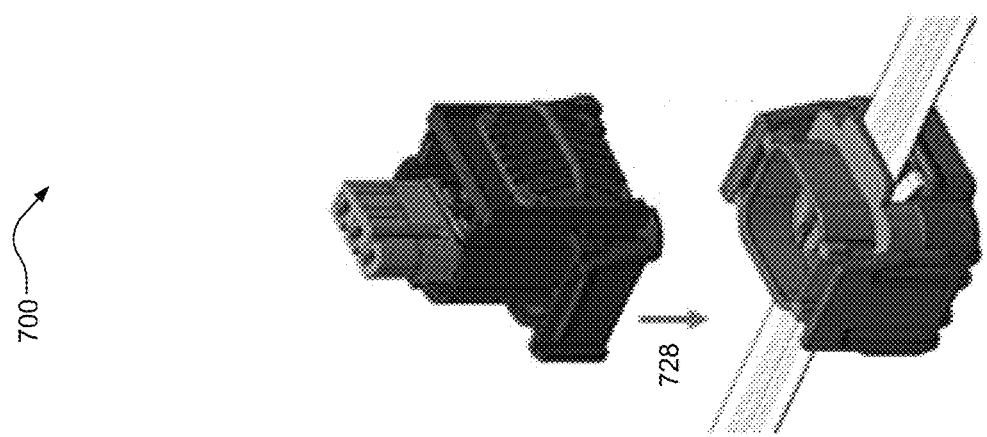

FLEXIBLE CIRCUIT TO TERMINAL CONNECTOR WITH WIPING ELECTRICAL CONTACTS

CROSS-REFERENCE TO RELATED APPLICATION(S)

The present application claims the benefit of U.S. Provisional Application No. 63/161,755, filed on Mar. 16, 2021. The disclosure of the above-identified application is incorporated herein by reference in its entirety.

FIELD

The present application generally relates to electrical connectors and, more particularly, to a flexible circuit (FC) to terminal connector with wiping electrical contacts.

BACKGROUND

Automotive electrical wiring harnesses have traditionally used round wire configurations and intensive manual labor assembly processes, which increases costs. Flexible circuit (FC) configurations can replace round wire configurations in automotive electrical wiring harnesses and thereby provide multiple benefits such as saving weight, reduced packaging size, and a significant reduction in automotive electrical harness manual assembly labor. FCs, however, are not easily connectable to other terminals, particularly via automated/robotic (non-manual) installation. Accordingly, while such conventional automotive electrical wiring harnesses do work well for their intended purpose, there exists an opportunity for improvement in the relevant art.

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

According to a first aspect of the present disclosure, an electrical connector system is presented. In one exemplary implementation, the electrical connector system comprises a first electrical connector comprising a connector housing and a set of exposed terminals disposed at least partially within the connector housing and having a tin-coating applied at respective terminal ends, and a second electrical connector comprising a flexible circuit (FC) comprising a set of conductive traces disposed in an insulation material and defining a set of exposed portions each where (i) the insulation material has been removed thereby exposing portions of the set of conductive traces and (ii) a tin-coating has been applied, a rigid stiffener device configured to receive and secure a portion of the FC corresponding to the set of tin-coated exposed portions, and a spring-loaded cover assembly configured to cover the portion of the FC and selectively engage with or connect to the rigid stiffener device, the spring cover assembly comprising a spring device and a spring retainer cover arranged on an opposing side of the FC that, when engaged with/connected to the rigid stiffener device, provides securing and downward force on the FC, wherein the connector housing and the spring-loaded cover assembly define a set of connection features that cause a lateral wiping action between the tin-coated terminal ends of the set of exposed terminals and the tin-coated exposed portions of the FC to improve an electrical connection therebetween during connection of the first and second electrical connectors.

According to some implementations, the spring device is a stainless steel spring. According to some implementations, the spring device is an elastomer-type spring. According to some implementations, the set of connection features comprises an L-shaped guide feature for an initial vertical connection movement followed by the lateral wiping action. According to some implementations, the electrical connector system is part of an automotive electrical system, and wherein the first electrical connector is further configured to electrically connect to another automotive electrical device or system.

According to some implementations, the first electrical connector further comprises an interface seal at an end of the connector housing proximate the terminal ends of the set of exposed terminals, and the second electrical connector further comprises an adhesive sealant disposed between the portion of the FC and the rigid stiffener device. According to some implementations, the interface seal is an asymmetrical interface seal that, after the lateral wiping action during connection of the first and second electrical connectors, becomes a symmetrical interface seal. According to some implementations, the set of connection features comprises an L-shaped guide feature for an initial vertical connection movement followed by the lateral wiping action.

According to another aspect of the present disclosure, a method of forming an electrical connector system is presented. In one exemplary implementation, the method comprises providing a first electrical connector comprising a connector housing and a set of exposed terminals disposed at least partially within the connector housing and having a tin-coating applied at respective terminal ends, providing a second electrical connector comprising an FC comprising a set of conductive traces disposed in an insulation material and defining a set of exposed portions each where (i) the insulation material has been removed thereby exposing portions of the set of conductive traces and (ii) a tin-coating has been applied, a rigid stiffener device configured to receive and secure a portion of the FC corresponding to the set of tin-coated exposed portions, and a spring-loaded cover assembly configured to cover the portion of the FC and selectively engage with or connect to the rigid stiffener device, the spring cover assembly comprising a spring device and a spring retainer cover arranged on an opposing side of the FC that, when engaged with/connected to the rigid stiffener device, provides securing and downward force on the FC, and electrically connecting the first and second electrical connectors, wherein the connector housing and the spring-loaded cover assembly define a set of connection features that cause a lateral wiping action between the tin-coated terminal ends of the set of exposed terminals and the tin-coated exposed portions of the FC to improve an electrical connection therebetween during the connection of the first and second electrical connectors.

According to some implementations, the spring device is a stainless steel spring. According to some implementations, the spring device is an elastomer-type spring. According to some implementations, the set of connection features comprises an L-shaped guide feature for an initial vertical connection movement followed by the lateral wiping action. According to some implementations, the electrical connector system is part of an automotive electrical system, and wherein the first electrical connector is further configured to electrically connect to another automotive electrical device or system.

According to some implementations, the first electrical connector further comprises an interface seal at an end of the connector housing proximate the terminal ends of the set of exposed terminals, and the second electrical connector further comprises an adhesive sealant disposed between the portion of the FC and the rigid stiffener device. According to some implementations, the interface seal is an asymmetrical interface seal that, after the lateral wiping action during connection of the first and second electrical connectors, becomes a symmetrical interface seal. According to some implementations, the set of connection features comprises an L-shaped guide feature for an initial vertical connection movement followed by the lateral wiping action.

According to yet another aspect of the present disclosure, an electrical connector system is presented. In one exemplary implementation, the electrical connector system comprises a first electrical connector means providing a connector housing means and a set of exposed terminals disposed at least partially within the connector housing means and having a tin-coating applied at respective terminal ends, and a second electrical connector means comprising an FC means comprising a set of conductive traces disposed in an insulation material and defining a set of exposed portions each where (i) the insulation material has been removed thereby exposing portions of the set of conductive traces and (ii) a tin-coating has been applied, a rigid stiffener device means for receiving and securing a portion of the FC corresponding to the set of tin-coated exposed portions, and a spring-loaded cover assembly means for covering the portion of the FC and for selectively engaging with or connecting to the rigid stiffener device means, the spring cover assembly means providing a spring device means and a spring retainer cover means arranged on an opposing side of the FC for, when engaged with/connected to the rigid stiffener device, securing and providing downward force on the FC means, wherein the connector housing means and the spring-loaded cover assembly means define a set of connection features that cause a lateral wiping action between the tin-coated terminal ends of the set of exposed terminals and the tin-coated exposed portions of the FC means to improve an electrical connection therebetween during connection of the first and second electrical connector means.

According to some implementations, the spring device means is a stainless steel spring or an elastomer-type spring. According to some implementations, the set of connection features comprises an L-shaped guide feature for an initial vertical connection movement followed by the lateral wiping action. According to some implementations, the first electrical connector means further provides an interface seal means at an end of the connector housing proximate the terminal ends of the set of exposed terminals and for sealing the electrical connection, and the second electrical connector further comprises an adhesive sealant disposed between the portion of the FC and the rigid stiffener device means, wherein the interface seal means is an asymmetrical interface seal that, after the lateral wiping action during connection of the first and second electrical connectors, becomes a symmetrical interface seal.

BRIEF DESCRIPTION OF THE DRAWING(S)

The present disclosure will become more fully understood from the detailed description and the accompanying drawings, wherein:

FIGS. 1A-1B illustrate perspective and exploded views of a first example electrical connector system configured for flexible circuit (FC) to terminal wiping action according to some implementations of the present disclosure;

FIGS. 4A-4B illustrate example applications of the first example electrical connector system of FIGS. 1A-1B according to some implementations of the present disclosure;

FIGS. 6A-6B illustrate perspective and exploded views of a second example electrical connector system configured for FC-to-terminal wiping action according to some implementations of the present disclosure;

FIGS. 7A-7E illustrate example assembly steps for a portion of the second example electrical connector system of FIGS. 6A-6B according to some implementations of the present disclosure.

DETAILED DESCRIPTION

Figure 2C:
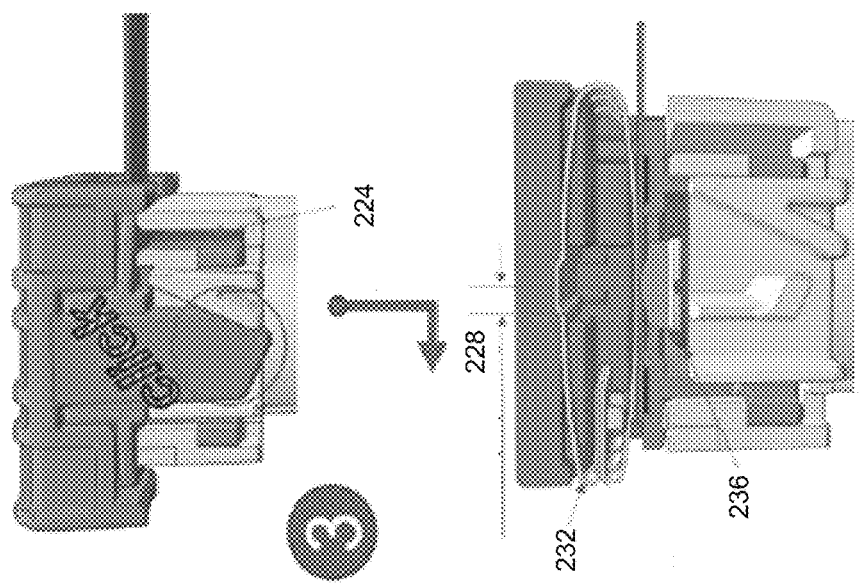
FIGS. 2A-2C illustrate side and cross-sectional views of a first example of the FC-to-terminal wiping action according to some implementations of the present disclosure.

As previously discussed, in the art of automotive wiring harnesses or "electrical connector systems," flexible circuit (FC) configurations can replace round wire configurations and thereby provide multiple benefits such as saving weight, reduced packaging size, and a significant reduction in manual assembly labor. FCs, however, are not easily connectable to other terminals, particularly via automated/robotic (non-manual) installation. Accordingly, improved electrical connector systems and methods configured for FC-to-terminal wiping action are presented herein. The electrical connector system creates an electrical connection between an FC and a metal terminal (e.g., of another connector). A reliable electrical connection is achieved with a low-cost tin (Sn) contact plating, by an automatic FC to metal terminal wiping action with contact force, during the connector to FC assembly process. The connector to FC assembly process is also well suited for automated robotic assembly, which can save costs compared to manual assembly/installation.

As generally mentioned above, FCs provide a variety of benefits compared to conventional round wire configurations. For example, FCs can be up to 75% lighter, can have improved heat dissipation, can provide lower profile packaging for easy integration into modular assemblies, can allow for automated manufacturing and eliminate manual errors such as terminal pull-outs (TPOs), can work well with just-in-time (JIT) manufacturing as changes can be made quickly and easily in the manufacturing pipeline, can support pre-integrated (welded/soldered) sensors/components, and can provide adhesive mount options thereby eliminating clips and/or other costly mechanical fasteners. The requirements for connectors for electrical connection to FCs include serviceability, easiness to mate (e.g., automated robotic installation), flexibility for electrical connection at a variety of locations along a length of the FC, minimized height for improved packaging, and pre-assembled terminals in the connectors to save on "lead prep" and connector plugging time.

Referring now to FIGS. 1A-1B, perspective and exploded views of a first example electrical connector system 100 configured for FC-to-terminal wiping action according to some implementations of the present disclosure are illustrated. This system 100 is also known or referred to as a "two-way" or "2 W" electrical connector system. The system 100 comprises a first electrical connector 104 comprising a connector housing 152 and a set of exposed terminals 148 disposed at least partially within the connector housing 140 and having a tin-coating applied at respective terminal ends 108. More particularly, an FC 116 includes these exposed contact portions 124 (i.e., stripped away insulation) of conductive traces (aluminum, copper, etc.) that are also tin-coated at these exposed contact portions 124. The system 100 further comprises a second electrical connector 108 comprising the FC 116 comprising a set of conductive traces disposed in an insulation material 120 and defining a set of exposed portions 124 each where (i) the insulation material 120 has been removed thereby exposing the portions of the set of conductive traces 124 and (ii) a tin-coating has been applied.

The system 100 further comprises a rigid stiffener device 140 configured to receive and secure a portion of the FC 116 corresponding to the set of tin-coated exposed portions 124. The stiffener device 140 optionally includes an adhesive sealant 144. The second electrical connector 108 further comprises a spring-loaded cover assembly 128 configured to cover the portion of the FC 116 and selectively engage with or connect to the rigid stiffener device 140. The spring-loaded cover assembly 128 comprises a spring device 136 and a spring retainer cover 132 arranged on an opposing side of the FC 116 that, when engaged with/connected to the rigid stiffener device 140, provides securing and downward force on the FC 116. In one exemplary implementation, the spring device 136 is a stainless steel (e.g., 301 stainless steel) spring. In another exemplary implementation, the spring device 136 is an elastomer-type (e.g., non-metal) spring. It will be appreciated that other spring materials and/or types could be utilized.

The rigid stiffener device 140 and the spring-loaded cover assembly 128 define a set of connection features that cause a lateral wiping action between the tin-coated terminal ends of the set of exposed terminals 112 and the tin-coated exposed portions 124 of the FC 116 to improve an electrical connection therebetween during connection of the first and second electrical connectors 104, 108. The connector housing 152 optionally optional incudes a seal retainer/connector 160 with an optional mating-end interface seal 166 (e.g., a pressure-sensitive adhesive silicon seal) at one end and tuning fork terminals 148 (e.g., brass/bronze alloy, with tin-coated exposed terminal ends 112) and an optional cable-end interface seal 156 at an opposing end. In some implementations, the connector housing 152 also includes a connector position assurance (CPA) or latch-release feature for unlocking/disconnecting the connector from the FC connector portion (see below with reference to FIG. 6B). The tin-coated tuning fork terminals 112, 148 are exposed for electrically contacting respective portions 124 of the FC 116. An outer edge of the FC 116 (e.g., the insulation material 120) can be copper-reinforced for improved registration with rigid the stiffener device 140.

Figure 2B:
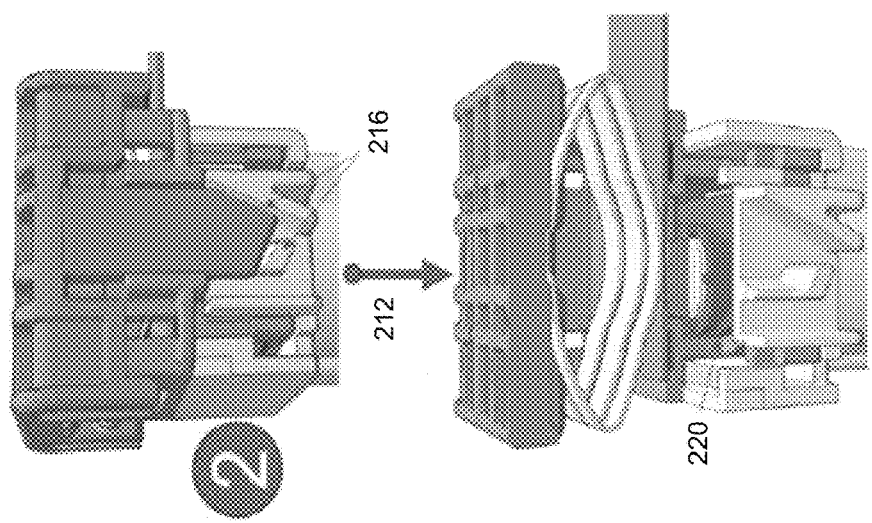
Figure 2A:
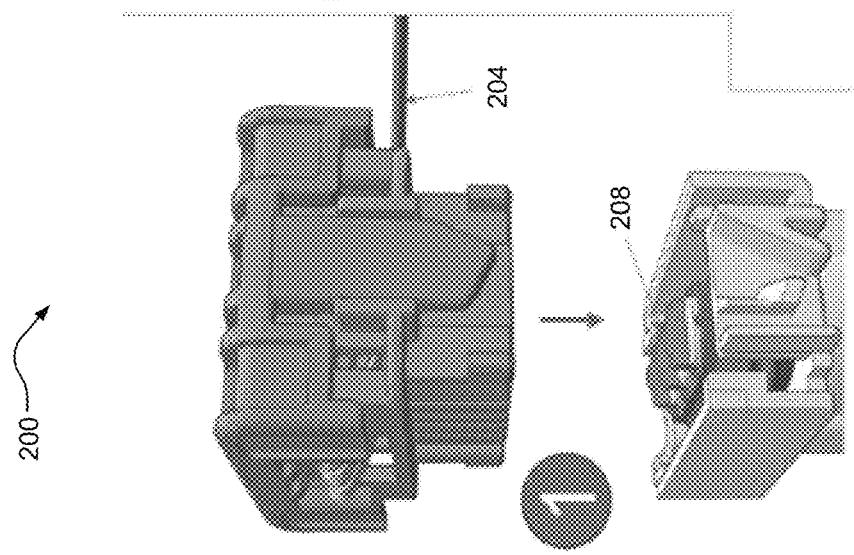

In one exemplary implementation, the design of the electrical connector system is suitable for automated robotic mating of the connector to FC using a simple "top down" assembly process. Referring now to FIGS. 2A-2C, side and cross-sectional views of a first example 200 of the FC-to-terminal wiping action according to some implementations of the present disclosure are illustrated. In a first step of FIG. 2A, the FC 204 is provided with a connector and begins to connect downward with another connector having the tin-coated terminal contacts 208. In a second step of FIG. 2B, the start of the FC-to-terminal wipe action begins at 212. As shown, angled ramp and latch forces 216 can provide this terminal wiping action. In FIG. 2B, the seal is in an asymmetrically compressed state 224. In FIG. 2C, the FC-to-terminal wipe action is completed (see the "click" sound). This involves the use of an L-shaped guide track that creates the terminal wiping action with contact force as shown at 228. For example only, the FC-to-terminal wipe distance could be only approximately one millimeter (mm). Also in FIG. 2C, the spring compression at 232 creates contact force, and the seal transitions to a symmetrically compressed state 232 (from previous asymmetrically compressed state 224).

Figure 3C:
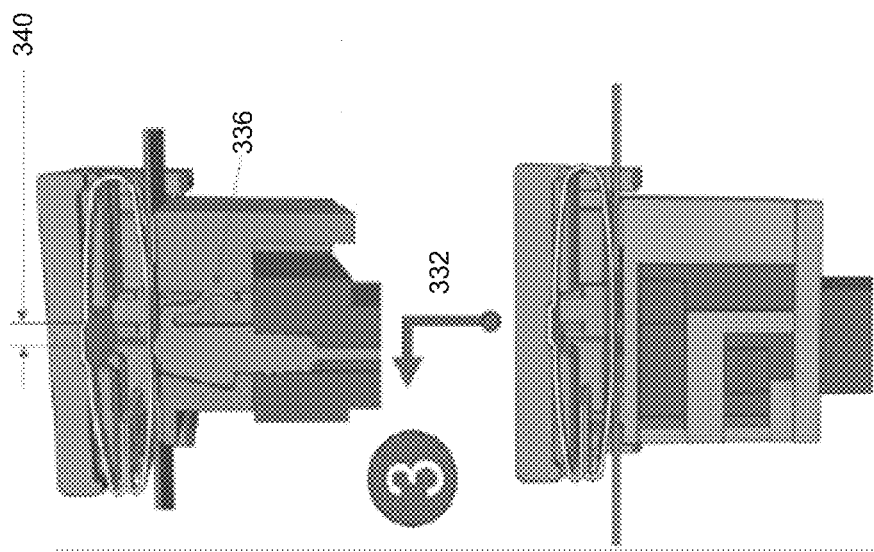
FIGS. 3A-3C illustrate side and cross-sectional views of a second example of the FC-to-terminal wiping action according to some implementations of the present disclosure.
Figure 3B:
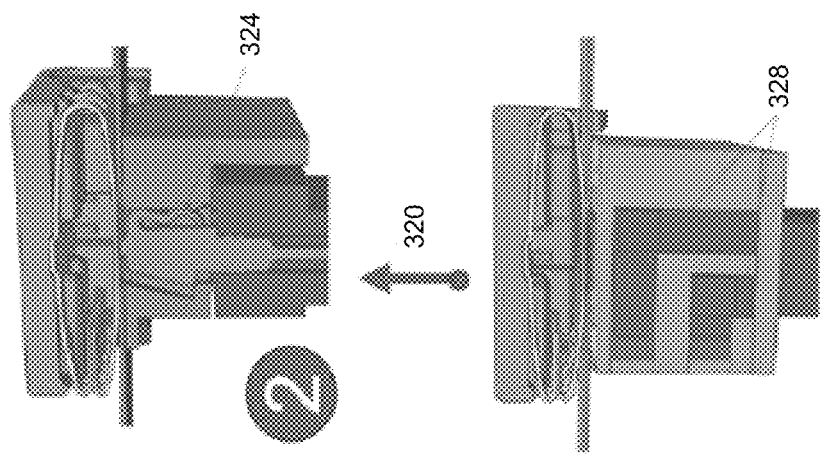
Figure 3A:
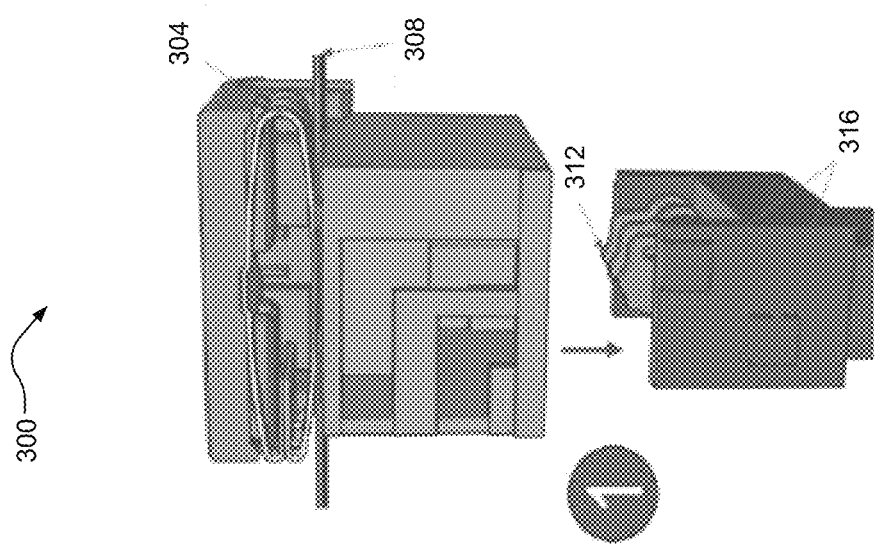

A similar alternative embodiment where the metal terminals have a spring feature that forces the terminal to FC wiping action during assembly. This embodiment also includes an "L" shaped guide track, and a backing spring for generating terminal to FC contact force. The wiping action occurs automatically during assembly of the connector to a FC due to the compression and subsequent release of the terminal spring. While sealed embodiments (e.g., pressure-sensitive silicon seals) are generally shown and described herein, it will be appreciated that any of the disclosed connector embodiments may be sealed or unsealed. Referring now to FIGS. 3A-3C, side and cross-sectional views of a second example 300 of the FC-to-terminal wiping action according to some implementations of the present disclosure are illustrated. In a first step of FIG. 3A, the spring is in a pre-loaded state 304 and the FC 308 is provided with a connector and begins to connect downward with another connector having the tin-coated terminal contacts 312 and a guide boss 316 defined by the connector's housing. In a second step of FIG. 3B, the start of the FC-to-terminal wipe action begins at 320. As shown, the terminal spring is compressed at 324 to force wiping action as the guide boss 316 begins to interact within the L-shaped tracks 328. In FIG. 3C, the FC-to-terminal wipe action is continued and then completed as the guide boss 316 finishes interaction/movement through the L-shaped tracks 328 causing terminal wiping contact force at 332. The spring also releases at 332 to create the terminal wiping. For example only, the FC-to-terminal wipe distance could be only approximately one millimeter (mm).

As previously discussed, the electrical connector system 100 is part of an automotive electrical system, and the first electrical connector is further configured to electrically connect to another automotive electrical device or system (not shown). Referring now to FIGS. 4A-4B, a sensor device 404 could directly electrically connect to a connector 408 having an FC 412 (see FIG. 4A) or, in another embodiment of FIG. 4B, a housed device 416 electrically connects via mating portions 420 to connector 424 having an FC 428. Non-limiting examples of these devices/systems for automotive applications include door harnesses, power mirror harnesses, seat harnesses, seat heating via flex, camera de-icing/de-fogging, headlamp harnesses, headlamp light emitting diode (LED) circuits, fascia/bumper harnesses (e.g., front/rear bumper sensors), headliner harnesses, power/data buses, vehicle-sized lead frame, zonal architecture, direct-attach flex-to-sensors, direct-attach flex-to-electronic control units/product circuit boards (ECUs/PCBs), high-voltage harnesses, high-voltage bus bars, battery distribution unit (BDU) harnesses, electrified vehicle (EV) battery current collectors, EV battery interconnects with integrated voltage sense, temperature sense, and fusing, and EV voltage sense harnesses. It will be appreciated, however, that these systems/methods are applicable to other automotive electrical components/assemblies, as well non-automotive electrical connection applications.

Figure 5:
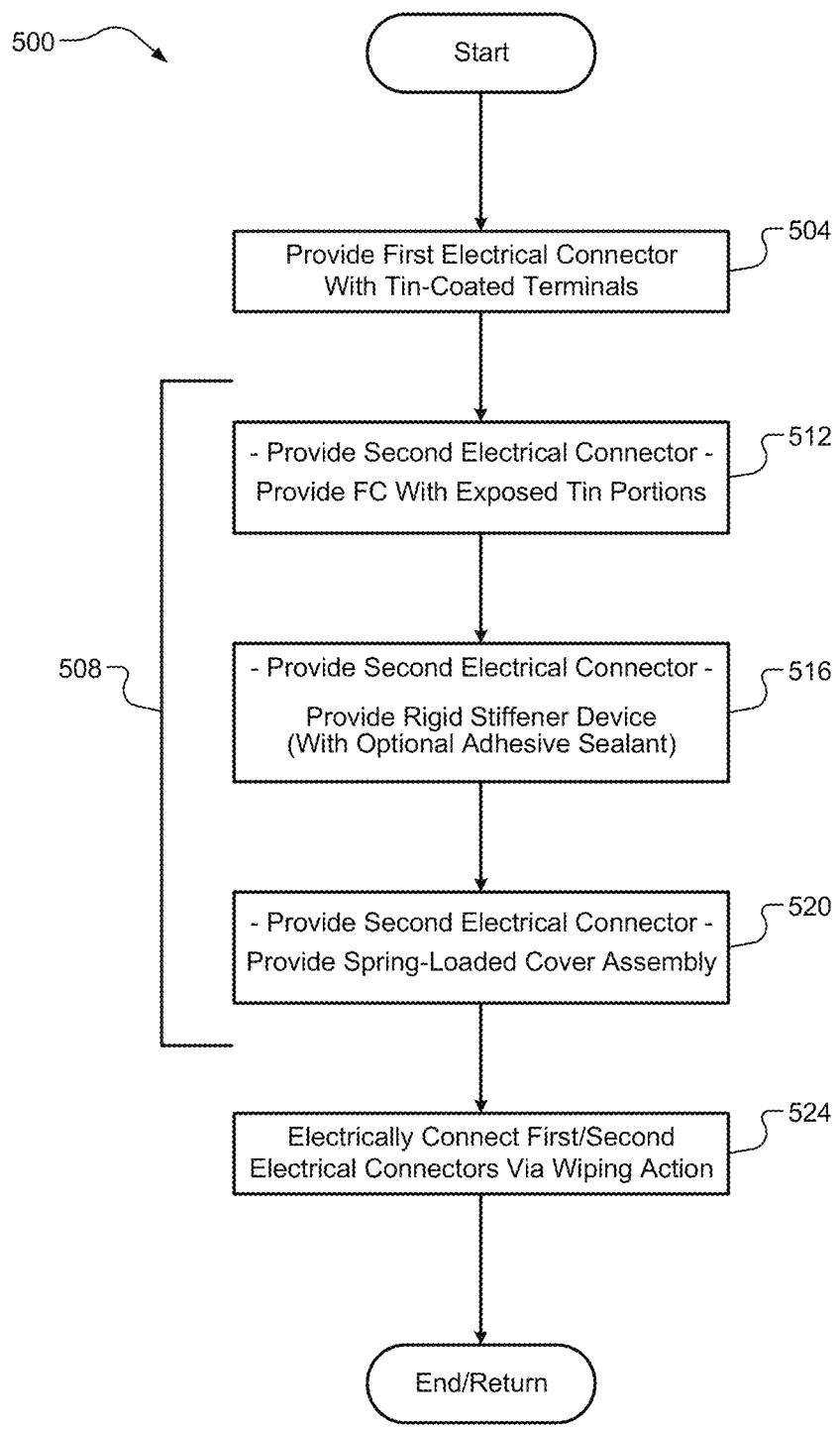
FIG. 5 illustrates a flow diagram of an example method of forming an electrical connector system including FC-to-terminal wiping action according to some implementations of the present disclosure.

Referring now to FIG. 5, a flow diagram of an example method 500 of forming an electrical connector system including FC-to-terminal wiping action according to some implementations of the present disclosure is illustrated. It will be appreciated that this method 500 could be applicable to the components described above and below (e.g., systems 100, 600) and illustrated throughout the FIGS., as well as any other suitably-configured electrical systems. At 504, a first electrical connector is provided, the first electrical connector comprising a connector housing and a set of exposed terminals disposed at least partially within the connector housing and having a tin-coating applied at respective terminal ends. At 508, a second electrical connector is provided, the second electrical connector is provided. This could include, for example, providing an FC comprising a set of conductive traces disposed in an insulation material and defining a set of exposed portions each where (i) the insulation material has been removed thereby exposing portions of the set of conductive traces and (ii) a tin-coating has been applied at 512, providing a rigid stiffener device configured to receive and secure a portion of the FC corresponding to the set of tin-coated exposed portions at 516, and providing a spring-loaded cover assembly configured to cover the portion of the FC and selectively engage with or connect to the rigid stiffener device, the spring cover assembly comprising a spring device and a spring retainer cover arranged on an opposing side of the FC that, when engaged with/connected to the rigid stiffener device, provides securing and downward force on the FC at 520. Lastly, at 524, electrical connection of the first and second electrical connectors is performed, wherein the connector housing and the spring-loaded cover assembly define a set of connection features that cause a lateral wiping action between the tin-coated terminal ends of the set of exposed terminals and the tin-coated exposed portions of the FC to improve an electrical connection therebetween during the connection of the first and second electrical connectors. The method 500 then ends or returns to 500 for one or more cycles.

Referring now to FIGS. 6A-6B, perspective and exploded views of a second/alternative example electrical connector system 600 configured for FC-to-terminal wiping action according to some implementations of the present disclosure are illustrated. This system 600 is also known or referred to as a "three-way" or "3 W" electrical connector system. The system 600 comprises a first electrical connector 604 comprising a rigid stiffener device 640 and a set of exposed terminals 648 disposed at least partially within a connector housing 652 and having a tin-coating applied at respective terminal ends 608. More particularly, an FC 616 includes these exposed contact portions 624 (i.e., stripped away insulation) of conductive traces (aluminum, copper, etc.) that are also tin-coated at these exposed contact portions 624. The system 600 further comprises a second electrical connector 608 comprising the FC 616 comprising a set of conductive traces disposed in an insulation material 620 and defining a set of exposed portions 624 each where (i) the insulation material 620 has been removed thereby exposing the portions of the set of conductive traces 624 and (ii) a tin-coating has been applied.

The system 600 further comprises the rigid stiffener device 640 configured to receive and secure a portion of the FC 616 corresponding to the set of tin-coated exposed portions 624. The second electrical connector 608 further comprises a spring-loaded cover assembly 628 configured to cover the portion of the FC 616 and selectively engage with or connect to the rigid stiffener device 640. The spring-loaded cover assembly 628 comprises a spring device 636 and a spring retainer cover 632 arranged on an opposing side of the FC 616 that, when engaged with/connected to the rigid stiffener device 640, provides securing and downward force on the FC 616. In one exemplary implementation, the spring device 636 is a stainless steel (e.g., 301 stainless steel) spring. In another exemplary implementation, the spring device 636 is an elastomer-type (e.g., non-metal) spring. It will be appreciated that other spring materials and/or types could be utilized.

The rigid stiffener device 640 and the spring-loaded cover assembly 628 define a set of connection features that cause a lateral wiping action between the tin-coated terminal ends of the set of exposed terminals 612 and the tin-coated exposed portions 624 of the FC 616 to improve an electrical connection therebetween during connection of the first and second electrical connectors 604, 608. The rigid stiffener device 640 includes an optional adhesive sealant 644 and interfaces with the connector housing 652 having an optional seal retainer/connector 664 with an optional mating-end interface seal 668 (e.g., a pressure-sensitive adhesive silicon seal) at one end and tuning fork terminals 648 (e.g., brass/bronze alloy, with tin-coated exposed terminal ends 612) and an optional cable-end interface seal 6656 at an opposing end. In some implementations, the housing 140 also includes a CPA or latch-release feature 660 for unlocking/disconnecting the connector from the FC connector portion 652. The tin-coated tuning fork terminals 612, 648 are exposed for electrically contacting respective portions 624 of the FC 616. An outer edge of the FC 616 (e.g., the insulation material 620) can be copper-reinforced for improved registration with the stiffener device 640.

Figure 7C:
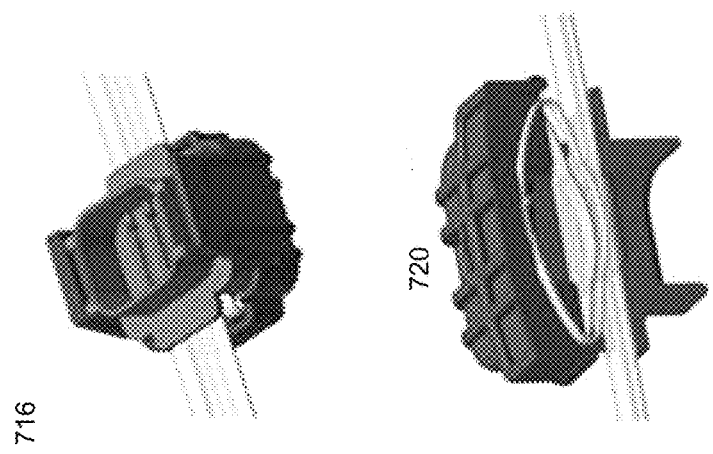
Figure 7B:
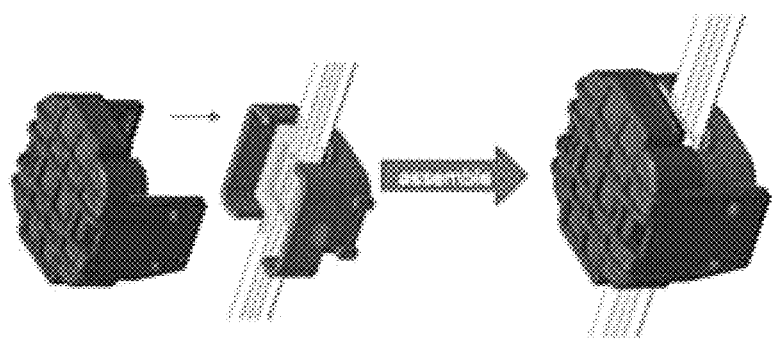
Figure 7A:
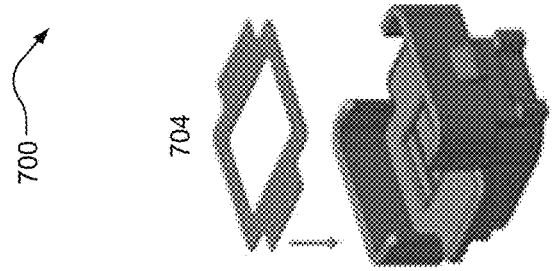
Figure 8B:
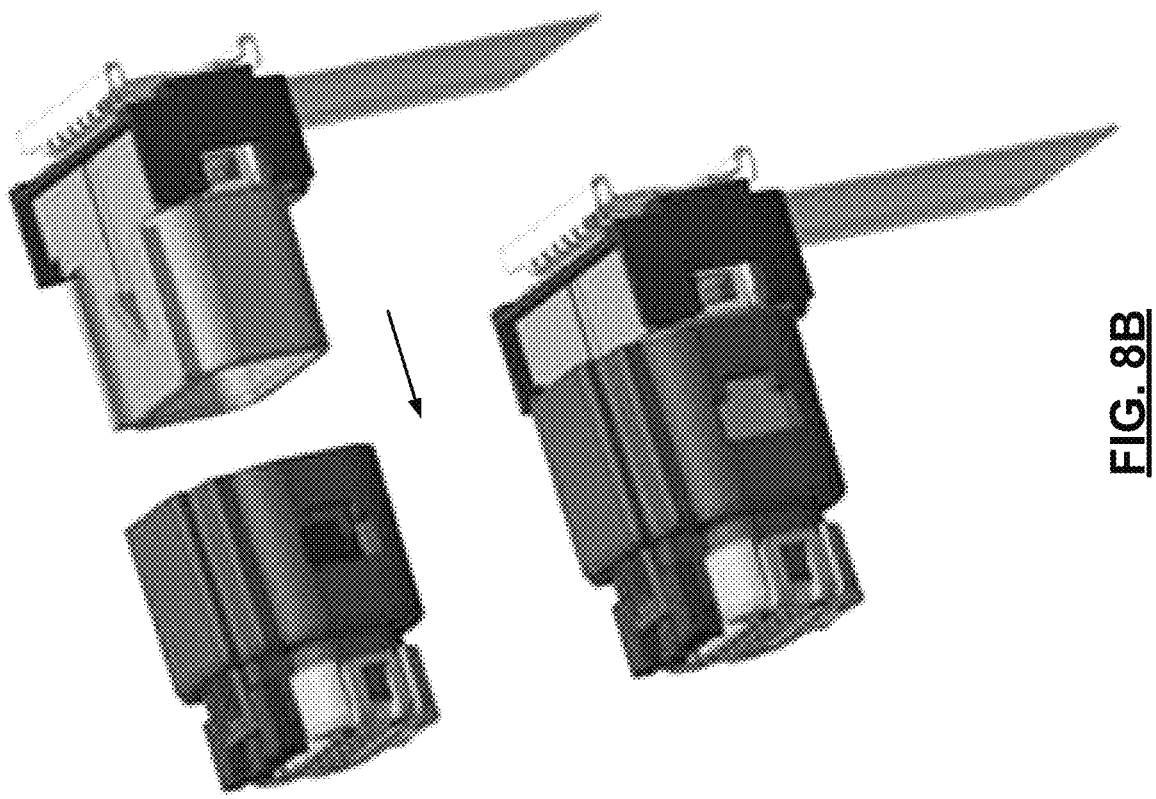
FIGS. 8A-8B illustrate example multi-row scalability of the electrical connector systems configured for FC-to-terminal wiping action according to some implementations of the present disclosure.
Figure 8A:
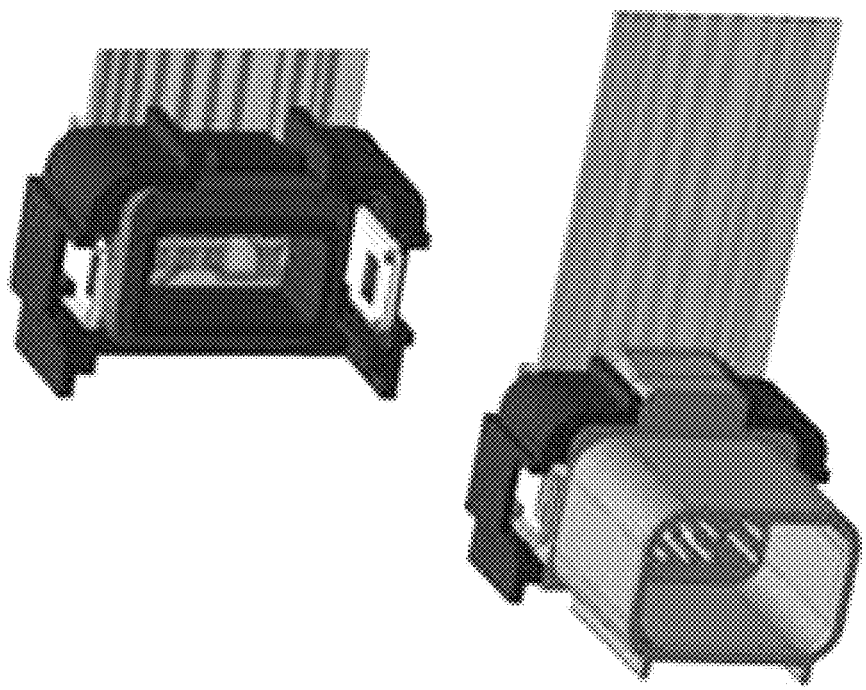

Referring now to FIGS. 7A-7C, example assembly steps for a portion of the second example electrical connector system 600 of FIGS. 6A-6B according to some implementations of the present disclosure are illustrated. In a first assembly step 704 (see FIG. 7A), the adhesive sealant is applied to the stiffener device. In a second assembly step 708 (see FIG. 7B), the FC is bonded to the stiffener device (e.g., with the help of copper reinforced registration edges 712). In a third assembly step 716 (see FIG. 7C), the spring cover assembly is applied to the stiffener device in a pre-staged position 720. In a fourth assembly step 724 (see FIG. 7D), the stiffener assembly is applied or connected to the connector body assembly (e.g., via an automation-compatible top-down assembly process 728). This includes the start of the secure and robust (i.e., tin-to-tin) FC-to-terminal contact wiping process at 732. In a fifth and final assembly step 736 (see FIG. 7E), the push process completes the connection (see the "click" sound) via the L-shaped wipe 740. For example only, the FC-to-terminal wipe distance 744 could be approximately 1.2 mm. Lastly, FIGS. 8A-8B illustrate example multi-row scalability of the electrical connector systems configured for FC-to-terminal wiping action according to some implementations of the present disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known procedures, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The term "and/or" includes any and all combinations of one or more of the associated listed items. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

The techniques described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage. Some portions of the above description present the techniques described herein in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times to refer to these arrangements of operations as modules or by functional names, without loss of generality.

The present disclosure also relates to an apparatus for performing at least a portion of the operations herein (e.g., robotic installation). This apparatus may be specially constructed for the required purposes, or it may comprise a general-purpose computer selectively activated or reconfigured by a computer program stored on a computer readable medium that can be accessed by the computer. Such a computer program may be stored in a tangible computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices. Certain aspects of the described techniques include process steps and instructions described herein in the form of an algorithm. It should be noted that the described process steps and instructions could be embodied in software, firmware or hardware, and when embodied in software, could be downloaded to reside on and be operated from different platforms used by real time network operating systems.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

It should also be understood that the mixing and matching of features, elements, methodologies and/or functions between various examples may be expressly contemplated herein so that one skilled in the art would appreciate from the present teachings that features, elements and/or functions of one example may be incorporated into another example as appropriate, unless described otherwise above.

What is claimed is:

1. An electrical connector system, comprising:
   a first electrical connector comprising a connector housing and a set of exposed terminals disposed at least partially within the connector housing and having a tin-coating applied at respective terminal ends; and
   a second electrical connector comprising:
      a flexible circuit (FC) comprising a set of conductive traces disposed in an insulation material and defining a set of exposed portions each where (i) the insulation material has been removed thereby exposing portions of the set of conductive traces and (ii) a tin-coating has been applied,
      a rigid stiffener device configured to receive and secure a portion of the FC corresponding to the set of tin-coated exposed portions, and
      a spring-loaded cover assembly configured to cover the portion of the FC and selectively engage with or connect to the rigid stiffener device, the spring cover assembly comprising a spring device and a spring retainer cover arranged on an opposing side of the FC that, when engaged with/connected to the rigid stiffener device, provides securing and downward force on the FC, wherein the connector housing and the spring-loaded cover assembly define a set of connection features that cause a lateral wiping action between the tin-coated terminal ends of the set of exposed terminals and the tin-coated exposed portions of the FC to improve an electrical connection therebetween during connection of the first and second electrical connectors.

2. The electrical connector system of claim 1, wherein the spring device is a stainless steel spring.

3. The electrical connector system of claim 1, wherein the spring device is an elastomer-type spring.

4. The electrical connector system of claim 1, wherein the set of connection features comprises an L-shaped guide feature for an initial vertical connection movement followed by the lateral wiping action.

5. The electrical connector system of claim 1, wherein:
the first electrical connector further comprises an interface seal at an end of the connector housing proximate the terminal ends of the set of exposed terminals; and
the second electrical connector further comprises an adhesive sealant disposed between the portion of the FC and the rigid stiffener device.

6. The electrical connector system of claim 5, wherein the interface seal is an asymmetrical interface seal that, after the lateral wiping action during connection of the first and second electrical connectors, becomes a symmetrical interface seal.

7. The electrical connector system of claim 6, wherein the set of connection features comprises an L-shaped guide feature for an initial vertical connection movement followed by the lateral wiping action.

8. The electrical connector system of claim 1, wherein the electrical connector system is part of an automotive electrical system, and wherein the first electrical connector is further configured to electrically connect to another automotive electrical device or system.

9. A method of forming an electrical connector system, the method comprising:
providing a first electrical connector comprising a connector housing and a set of exposed terminals disposed at least partially within the connector housing and having a tin-coating applied at respective terminal ends;
providing a second electrical connector comprising:
a flexible circuit (FC) comprising a set of conductive traces disposed in an insulation material and defining a set of exposed portions each where (i) the insulation material has been removed thereby exposing portions of the set of conductive traces and (ii) a tin-coating has been applied,
a rigid stiffener device configured to receive and secure a portion of the FC corresponding to the set of tin-coated exposed portions, and
a spring-loaded cover assembly configured to cover the portion of the FC and selectively engage with or connect to the rigid stiffener device, the spring cover assembly comprising a spring device and a spring retainer cover arranged on an opposing side of the FC that, when engaged with/connected to the rigid stiffener device, provides securing and downward force on the FC; and electrically connecting the first and second electrical connectors, wherein the connector housing and the spring-loaded cover assembly define a set of connection features that cause a lateral wiping action between the tin-coated terminal ends of the set of exposed terminals and the tin-coated exposed portions of the FC to improve an electrical connection therebetween during the connection of the first and second electrical connectors.

10. The method of claim 9, wherein the spring device is a stainless steel spring.

11. The method of claim 9, wherein the spring device is an elastomer-type spring.

12. The method of claim 9, wherein the set of connection features comprises an L-shaped guide feature for an initial vertical connection movement followed by the lateral wiping action.

13. The method of claim 9, wherein:
the first electrical connector further comprises an interface seal at an end of the connector housing proximate the terminal ends of the set of exposed terminals; and
the second electrical connector further comprises an adhesive sealant disposed between the portion of the FC and the rigid stiffener device.

14. The method of claim 13, wherein the interface seal is an asymmetrical interface seal that, after the lateral wiping action during connection of the first and second electrical connectors, becomes a symmetrical interface seal.

15. The method of claim 14, wherein the set of connection features comprises an L-shaped guide feature for an initial vertical connection movement followed by the lateral wiping action.

16. The method of claim 9, wherein the electrical connector system is part of an automotive electrical system, and wherein the first electrical connector is further configured to electrically connect to another automotive electrical device or system.

17. An electrical connector system, comprising:
a first electrical connector means providing a connector housing means and a set of exposed terminals disposed at least partially within the connector housing means and having a tin-coating applied at respective terminal ends; and
a second electrical connector means comprising:
a flexible circuit (FC) means comprising a set of conductive traces disposed in an insulation material and defining a set of exposed portions each where (i) the insulation material has been removed thereby exposing portions of the set of conductive traces and (ii) a tin-coating has been applied,
a rigid stiffener device means for receiving and securing a portion of the FC corresponding to the set of tin-coated exposed portions, and
a spring-loaded cover assembly means for covering the portion of the FC and for selectively engaging with or connecting to the rigid stiffener device means, the spring cover assembly means providing a spring device means and a spring retainer cover means arranged on an opposing side of the FC for, when engaged with/connected to the rigid stiffener device, securing and providing downward force on the FC means,
wherein the connector housing means and the spring-loaded cover assembly means define a set of connection features that cause a lateral wiping action between the tin-coated terminal ends of the set of exposed terminals and the tin-coated exposed portions of the FC means to improve an electrical connection therebetween during connection of the first and second electrical connector means.

18. The electrical connector system of claim 17, wherein the spring device means is a stainless steel spring or an elastomer-type spring.

19. The electrical connector system of claim 17, wherein the set of connection features comprises an L-shaped guide feature for an initial vertical connection movement followed by the lateral wiping action.

20. The electrical connector system of claim 17, wherein:
the first electrical connector means further provides an interface seal means at an end of the connector housing proximate the terminal ends of the set of exposed terminals and for sealing the electrical connection; and
the second electrical connector further comprises an adhesive sealant disposed between the portion of the FC and the rigid stiffener device means,
wherein the interface seal means is an asymmetrical interface seal that, after the lateral wiping action during connection of the first and second electrical connectors, becomes a symmetrical interface seal.

* * * * *